(12) United States Patent
Horikoshi et al.

(10) Patent No.: US 11,986,867 B2
(45) Date of Patent: May 21, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Akira Horikoshi, Kyoto (JP); Shohei Nakamura, Kyoto (JP); Shigeru Takatsuji, Kyoto (JP); Motohiro Kono, Kyoto (JP); Takahiro Kimura, Kyoto (JP); Kenji Kobayashi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 74 days.

(21) Appl. No.: 17/016,379

(22) Filed: Sep. 10, 2020

(65) Prior Publication Data
US 2021/0086238 A1    Mar. 25, 2021

(30) Foreign Application Priority Data

Sep. 24, 2019    (JP) ................. 2019-172560

(51) Int. Cl.
*B08B 7/00*    (2006.01)
*B08B 3/08*    (2006.01)
(Continued)

(52) U.S. Cl.
CPC .............. *B08B 7/0035* (2013.01); *B08B 3/08* (2013.01); *B08B 5/02* (2013.01); *B08B 7/0021* (2013.01);
(Continued)

(58) Field of Classification Search
CPC ........... B08B 3/08; B08B 5/02; B08B 7/0021; B08B 7/0035; B08B 7/04;
(Continued)

(56) References Cited

U.S. PATENT DOCUMENTS 5,998,757 A * 12/1999 Schneider ................ H05H 1/30
219/121.36
6,429,400 B1 * 8/2002 Sawada ............. H01J 37/32366
219/121.52

(Continued)

FOREIGN PATENT DOCUMENTS

| CN | 101167162 | 4/2008 |
| CN | 101667543 | 3/2010 |

(Continued)

OTHER PUBLICATIONS

Heping Li et al., "Measurements of the Electron Temperature Near a Flat Plate Impinged by an Argon Plasma Jet", Journal of Engineering Thermophysics, Mar. 1999, with English abstract, pp. 1-5, vol. 20, No. 2.

(Continued)

*Primary Examiner* — Duy Vu N Deo
*Assistant Examiner* — Christopher Remavege
(74) *Attorney, Agent, or Firm* — JCIPRNET

(57) ABSTRACT

A liquid film of a processing liquid containing at least one of sulfuric acid, a sulfate, peroxosulfuric acid, and a peroxosulfate, or a processing liquid containing hydrogen peroxide is formed on a substrate. A plasma is radiated to the liquid film. Thereby, a substrate processing method in which substrate processing using an oxidizing power of the processing liquid can be efficiently performed is provided.

8 Claims, 10 Drawing Sheets

(51) Int. Cl.
*B08B 5/02* (2006.01)
*B08B 7/04* (2006.01)
*H01J 37/32* (2006.01)
*H01L 21/02* (2006.01)
*H01L 21/67* (2006.01)

(52) U.S. Cl.
CPC .......... *B08B 7/04* (2013.01); *H01J 37/32348* (2013.01); *H01J 37/3244* (2013.01); *H01J 37/32568* (2013.01); *H01J 37/32715* (2013.01); *H01L 21/02057* (2013.01); *H01L 21/6704* (2013.01); *H01J 2237/20214* (2013.01)

(58) Field of Classification Search
CPC ....... H01J 2237/20214; H01J 37/32348; H01J 37/3244; H01J 37/32568; H01J 37/32715; H01L 21/02057; H01L 21/31133; H01L 21/6704; H01L 21/6708; H01L 25/0753
See application file for complete search history.

(56) References Cited

U.S. PATENT DOCUMENTS

| | | | |
|---|---|---|---|
| 6,686,558 B2* | 2/2004 | Selitser | B23K 10/003 219/121.48 |
| 7,435,686 B2* | 10/2008 | Verhaverbeke | G03F 7/423 257/E21.255 |
| 7,449,416 B2 | 11/2008 | Becknell et al. | |
| 7,591,957 B2* | 9/2009 | Carr | C23C 16/047 219/121.36 |
| 7,632,756 B2* | 12/2009 | Verhaverbeke | G03F 7/423 257/E21.255 |
| 8,394,720 B2 | 3/2013 | Fujihara | |
| 8,399,794 B2* | 3/2013 | Tsuji | H01J 37/32366 219/121.36 |
| 8,574,445 B2 | 11/2013 | Cho et al. | |
| 9,520,270 B2 | 12/2016 | Mohanty et al. | |
| 9,937,520 B2 | 4/2018 | Kanaoka et al. | |
| 10,668,497 B2* | 6/2020 | Akizuki | H01L 21/67 |
| 11,538,697 B2* | 12/2022 | Nam | H01J 37/32715 |
| 2006/0046482 A1* | 3/2006 | Verhaverbeke | H01L 21/31133 257/E21.255 |
| 2007/0217090 A1* | 9/2007 | Takayanagi | H05H 1/2406 361/1 |
| 2007/0227556 A1* | 10/2007 | Bergman | G03F 7/423 134/28 |
| 2009/0065485 A1* | 3/2009 | O'Neill | H05H 1/46 219/121.48 |
| 2010/0055915 A1* | 3/2010 | Kanegae | B08B 7/0035 156/345.21 |
| 2010/0095981 A1 | 4/2010 | Kamikawa | |
| 2012/0312334 A1* | 12/2012 | Dobashi | H01L 21/31133 134/198 |
| 2014/0060573 A1* | 3/2014 | Yoshida | H01L 21/31133 134/105 |
| 2017/0017151 A1* | 1/2017 | Matsushima | G03F 1/82 |
| 2019/0035636 A1* | 1/2019 | Yoshimizu | H01J 37/32 |
| 2020/0124960 A1 | 4/2020 | Matsushima et al. | |

FOREIGN PATENT DOCUMENTS

| | | |
|---|---|---|
| CN | 102906858 | 1/2013 |
| CN | 103882412 | 6/2014 |
| CN | 109545677 | 3/2019 |
| JP | 2002053312 | 2/2002 |
| JP | 2003133290 | 5/2003 |
| JP | 2005044900 | 2/2005 |
| JP | 2008512004 | 4/2008 |
| JP | 2010034532 | 2/2010 |
| JP | 2014045150 | 3/2014 |
| KR | 100713707 | 5/2007 |
| KR | 100749545 | 8/2007 |
| KR | 20080018447 | 2/2008 |
| KR | 20160012932 | 2/2016 |
| KR | 20160132068 | 11/2016 |
| KR | 20170117582 | 10/2017 |
| TW | 200615715 | 5/2006 |
| TW | 201606908 | 2/2016 |
| WO | 2007148470 | 12/2007 |
| WO | 2016152371 | 9/2016 |

OTHER PUBLICATIONS

Haoyu Li et al., "Ultrasound Augmented leaching of nickel sulfate in sulfuric acid and hydrogen peroxide media", Ultrasonics Sonochemistry, Aug. 30, 2017, pp. 1-27, vol. 40, No. 6.

* cited by examiner

SUBSTRATE PROCESSING METHOD AND SUBSTRATE PROCESSING APPARATUS

CROSS-REFERENCE TO RELATED APPLICATION

This application claims the priority benefit of Japan application no. 2019-172560, filed on Sep. 24, 2019. The entirety of the above-mentioned patent application is hereby incorporated by reference herein and made a part of this specification.

BACKGROUND

Technical Field

The disclosure relates to a substrate processing method and a substrate processing apparatus, and more particularly to a substrate processing method and a substrate processing apparatus using a plasma.

Description of Related Art

A manufacturing method of a semiconductor device often involves a wet processing process for removing a resist film from a substrate. As a typical process thereof, there is a method using the oxidizing power of peroxosulfuric acid generated in a processing liquid which is a mixed liquid of sulfuric acid and hydrogen peroxide solution. In order to continuously and stably generate the peroxosulfuric acid, usually, hydrogen peroxide solution has to be additionally added to the processing liquid. Consequently, a burden of waste liquid treatment is high and the recycling of the sulfuric acid is difficult.

On the other hand, in the resist removing method disclosed in Japanese Patent Laid-Open No. 2002-53312, peroxosulfuric acid is generated by radiating an oxygen plasma to a solution containing sulfuric acid. Then, a wafer having a resist formed on a surface thereof is immersed in a solution containing peroxosulfuric acid. According to this method, generation of peroxosulfuric acid can be promoted by radiating the oxygen plasma to the sulfuric acid. According to the above-described publication, it is claimed that this method makes it possible to maintain the resist removing ability of the mixed liquid of sulfuric acid and hydrogen peroxide without adding hydrogen peroxide.

A process of removing a resist film from a substrate often requires a large amount of time, energy, and consumption of chemical materials, and therefore the efficiency of the process is required to be improved. Also, not only in substrate processing for removing a resist film but also in other substrate processing, improving the efficiency thereof is beneficial for manufacturers as a matter of course.

This disclosure provides a substrate processing method in which substrate processing using the oxidizing power of a processing liquid can be efficiently performed.

SUMMARY

A substrate processing method including a process of forming a liquid film of a processing liquid containing at least one of sulfuric acid, a sulfate, peroxosulfuric acid, and a peroxosulfate, or a processing liquid containing hydrogen peroxide, and a process of radiating a plasma to the liquid film.

A substrate processing apparatus which processes a substrate using a processing liquid containing at least one of sulfuric acid, a sulfate, peroxosulfuric acid, and a peroxosulfate, or a processing liquid containing hydrogen peroxide, and the substrate processing apparatus includes a holding unit which holds the substrate, a liquid supply unit which supplies the processing liquid onto the substrate so that a liquid film of the processing liquid is formed on the substrate, and a plasma source which radiates a plasma to the liquid film.

DESCRIPTION OF THE EMBODIMENTS

Hereinafter, embodiments of the disclosure will be described with reference to the drawings. In the following drawings, the same or corresponding parts will be denoted by the same reference signs and description thereof will not be repeated.

First Embodiment

Figure 1:
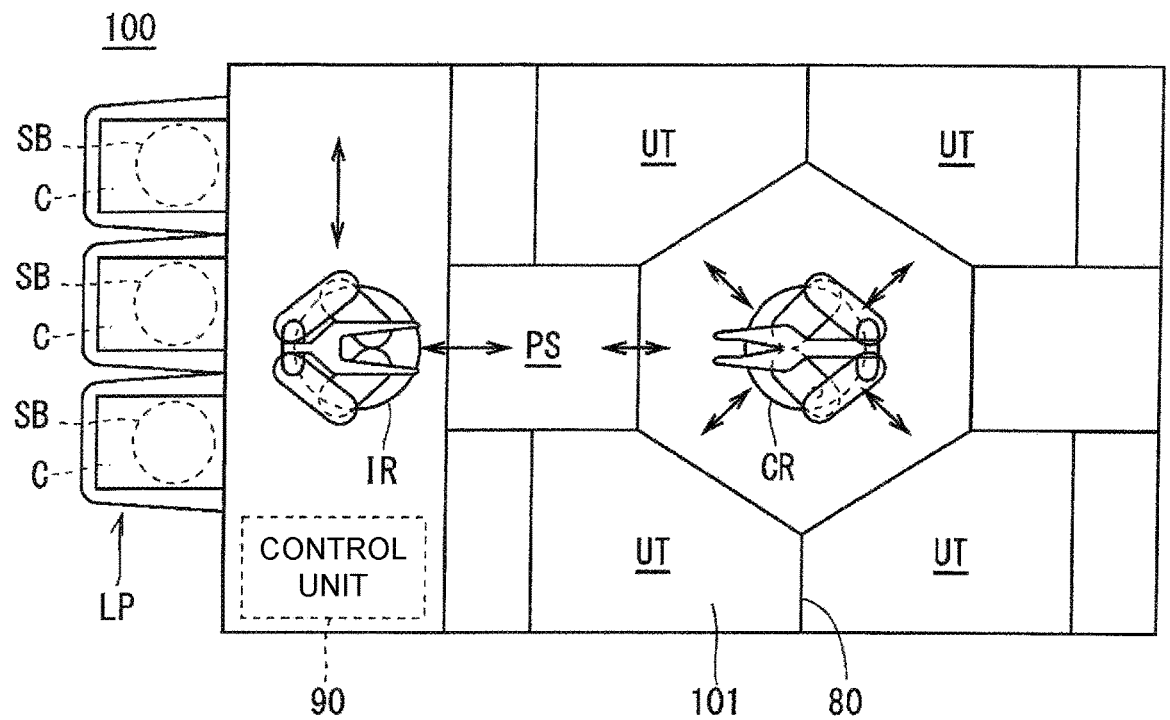
FIG. 1 is a plan view schematically illustrating a configuration of a substrate processing system according to a first embodiment of the disclosure.

FIG. 1 is a plan view schematically illustrating an example of a configuration of a substrate processing system 100 according to a first embodiment. The substrate processing system 100 includes a load port LP, an indexer robot IR, a center robot CR, a control unit 90, and at least one processing unit UT (four processing units in FIG. 1). The plurality of processing units UT is for processing a substrate SB (wafer), and at least one of them corresponds to a substrate processing apparatus 101 to be described specifically below. The substrate processing apparatus 101 is a single-wafer-processing type apparatus that can be used for substrate processing, and more specifically, a single-wafer-processing type apparatus that can be used for processing of removing organic matter adhered to the substrate SB. The organic matter is typically a used resist film. The resist film is one that has been used as, for example, an implantation mask for an ion implantation process. The substrate processing apparatus 101 may have a chamber 80. In that case, substrate processing can be performed in a desired atmosphere by controlling an atmosphere in the chamber 80.

The control unit 90 can control an operation of each unit included in the substrate processing system 100. Each of carriers C is a container that accommodates the substrate SB. The load port LP is a container holding mechanism that holds a plurality of carriers C. The indexer robot IR can transfer the substrate SB between the load port LP and a substrate placement unit PS. The center robot CR can transfer the substrate SB from any one of the substrate placement unit PS and at least one of the processing units UT to another one. With the above-described configuration, the indexer robot IR, the substrate placement unit PS, and the center robot CR function as a transfer mechanism that transfers the substrate SB between each of the processing units UT and the load port LP.

The substrate SB to be processed is taken out from the carrier C by the indexer robot IR and transferred to the center robot CR via the substrate placement unit PS. The center robot CR loads the substrate SB to be processed into the processing unit UT. The processing unit UT performs processing for the substrate SB. The processed substrate SB is taken out from the processing unit UT by the center robot CR, goes through another processing unit UT as necessary, and then is transferred to the indexer robot IR via the substrate placement unit PS. The indexer robot IR loads the processed substrate SB into the carrier C. As described above, the processing for the substrate SB is performed.

Figure 2:
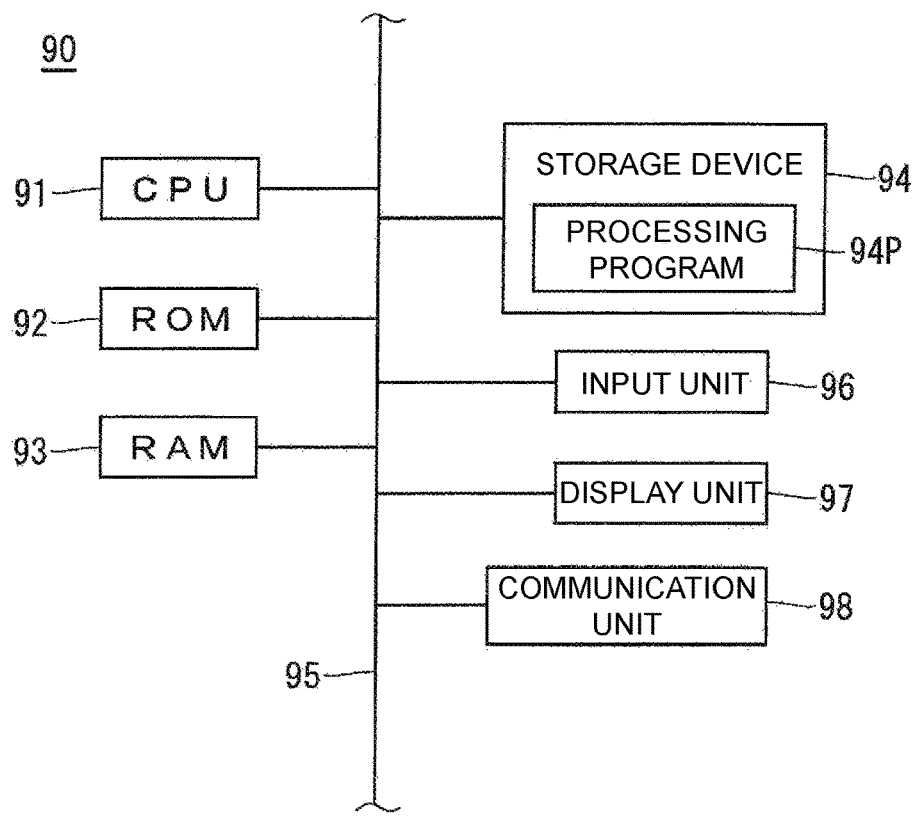
FIG. 2 is a block diagram schematically illustrating a configuration of a control unit included in the substrate processing system of FIG. 1.

FIG. 2 is a block diagram schematically illustrating a configuration of the control unit 90 (FIG. 1). The control unit 90 may be configured by a general computer having an electric circuit. Specifically, the control unit 90 includes a central processing unit (CPU) 91, a read only memory (ROM) 92, a random access memory (RAM) 93, a storage device 94, an input unit 96, a display unit 97, a communication unit 98, and a bus line 95 interconnecting them.

The ROM 92 stores basic programs. The RAM 93 is provided as a work area when the CPU 91 performs a predetermined processing. The storage device 94 is configured by a nonvolatile storage device such as a flash memory or a hard disk device. The input unit 96 is configured by switches of various types, a touch panel, and the like, and receives an input setting instruction such as a processing recipe from an operator. The display unit 97 is configured by, for example, a liquid crystal display device, a lamp, and the like, and displays information of various types under the control of the CPU 91. The communication unit 98 has a data communication function using a local area network (LAN) or the like. In the storage device 94, a plurality of modes for controlling each device constituting the substrate processing system (FIG. 1) is preset. When the CPU 91 executes a processing program 94P, one of the plurality of modes described above is selected, and each device is controlled according to the mode. Also, the processing program 94P may be stored also in a recording medium. When a recording medium is used, the processing program 94P can be installed in the control unit 90. Also, some or all of the functions executed by the control unit 90 do not necessarily have to be realized by software and may be realized by hardware such as a dedicated logic circuit.

Figure 3:
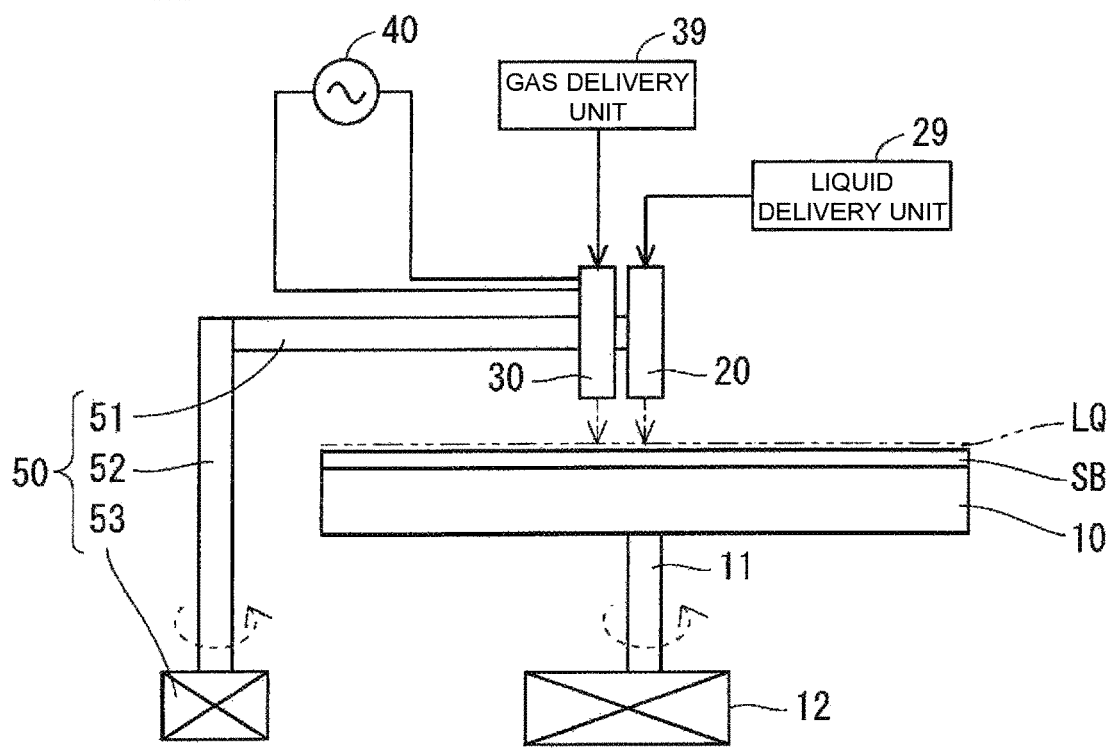
FIG. 3 is a side view schematically illustrating a configuration of a substrate processing apparatus according to the first embodiment of the disclosure.
Figure 4:
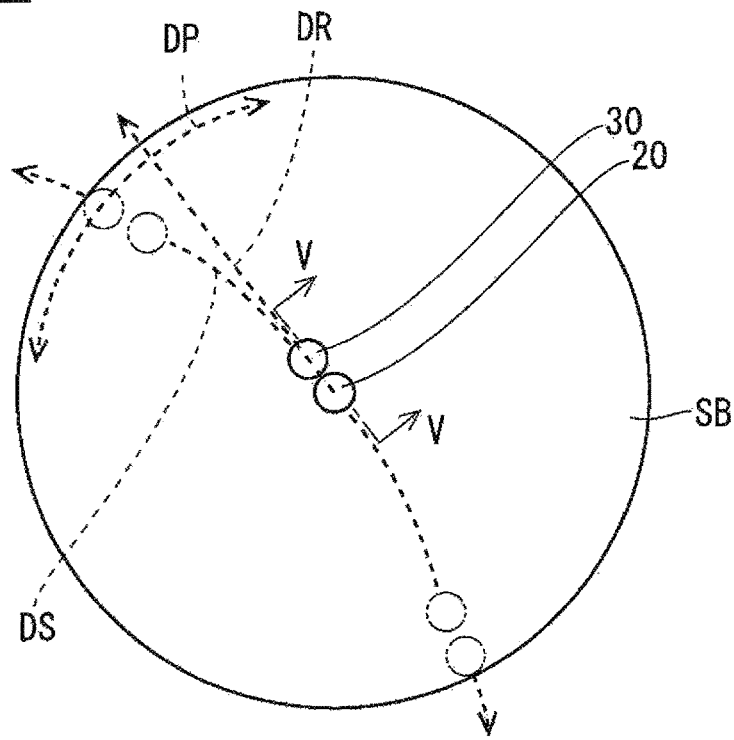
FIG. 4 is a plan view schematically illustrating a disposition of a liquid supply unit and a plasma source included in the substrate processing apparatus of FIG. 1.
Figure 5:
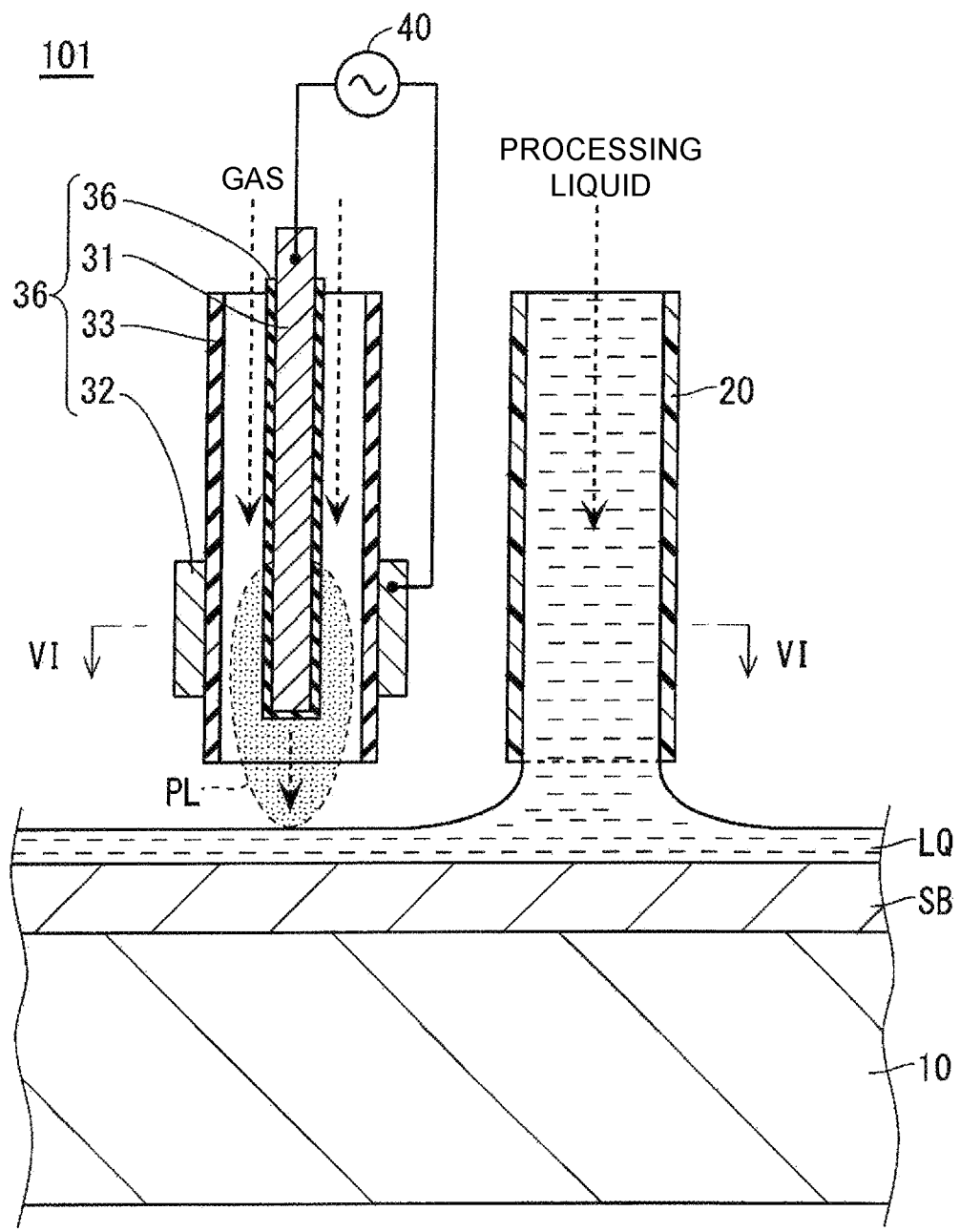
FIG. 5 is a schematic partial cross-sectional view along line V-V of FIG. 4.
Figure 6:
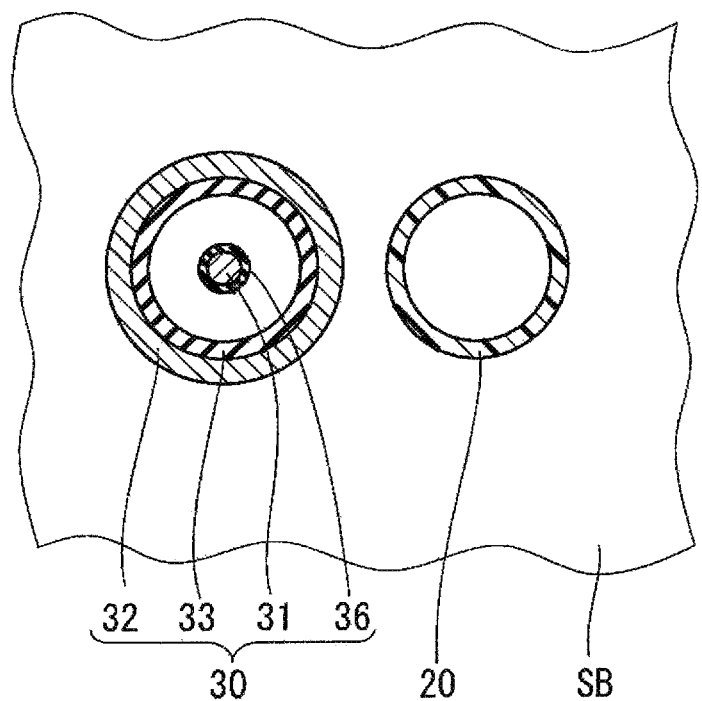
FIG. 6 is a schematic partial cross-sectional view along line VI-VI of FIG. 5.

FIG. 3 is a side view schematically illustrating a configuration of the substrate processing apparatus 101 according to the first embodiment. FIG. 4 is a plan view schematically illustrating a disposition of a liquid supply unit 20 and a plasma source 30 included in the substrate processing apparatus 101. FIG. 5 is a schematic partial cross-sectional view along line V-V of FIG. 4. FIG. 6 is a schematic partial cross-sectional view along line VI-VI of FIG. 5. The substrate processing apparatus 101 is for processing the substrate SB using a processing liquid. Specifically, the substrate processing apparatus 101 is for removing a resist film (not illustrated) from the substrate SB using the processing liquid.

Constituents illustrated in each of the figures after FIG. 3 may be surrounded by the chamber 80 (FIG. 1). A pressure in the chamber 80 may be approximately an atmospheric pressure (for example, 0.5 atm or more and 2 atm or less). In other words, each of the plasma sources to be described below may be an atmospheric pressure plasma source. An atmosphere in the chamber 80 may be, for example, air or an inert gas. In a case of air, since no special gas is required, process costs can be reduced. In a case of an inert gas, oxygen atoms in the gas adversely affecting the substrate processing can be avoided. The inert gas may be, for example, nitrogen gas or a rare gas. The rare gas may be, for example, argon gas.

The substrate processing apparatus 101 includes a substrate holder 10 (holding unit), a liquid nozzle 20 (liquid supply unit), a liquid delivery unit 29, a plasma source 30, a gas delivery unit 39, and an alternating current (AC) power supply 40 (power supply). The substrate holder 10 holds the substrate SB. The liquid delivery unit 29 delivers a processing liquid to the liquid nozzle 20. The processing liquid is a liquid containing at least one of sulfuric acid, a sulfate, peroxosulfuric acid, and a peroxosulfate, or a liquid containing hydrogen peroxide, and may be a liquid containing sulfuric acid. The processing liquid is typically an aqueous solution. The liquid nozzle 20 supplies the processing liquid onto the substrate SB so that a liquid film LQ of the processing liquid is formed on the substrate SB. The gas delivery unit 39 delivers a gas to the plasma source 30. The gas may contain, for example, at least any one of $H_2$, $O_2$, $N_2$, Ar, and He. For example, when the gas contains $O_2$, an oxygen plasma can be generated. The plasma source 30 radiates a plasma PL to the liquid film LQ.

Also, the substrate processing apparatus 101 includes a shaft body 11 and a rotary motor 12 (rotation drive unit). The shaft body 11 is attached to a center of the substrate holder 10. The rotary motor 12 rotates the shaft body. With this configuration, the substrate holder 10 can be rotated, and thus rotation of the substrate SB can be obtained.

Also, the substrate processing apparatus includes an arm 51, a shaft body 52, and an angle actuator 53 (scan drive unit). The angle actuator 53 adjusts an angle around an axis of the shaft body 52. One end of the arm 51 is fixed to the shaft body 52, and the other end of the arm 51 is disposed away from the axis of the shaft body 52. When the plasma source 30 is attached to the other end, the plasma source 30 is configured to be rockable in a radial direction DR (FIG. 4) for the rotation of the substrate SB as illustrated by an arrow DS (FIG. 4). Further, a moving direction of the plasma source 30 due to the rocking need only have a component in the radial direction DR, and does not need to be exactly parallel to the radial direction DR.

In the present embodiment, the plasma source 30 and the liquid nozzle 20 are fixed to each other. Thereby, the liquid nozzle 20 also rocks in accordance with the rocking of the plasma source 30. Further, as a modified example, a position of the liquid nozzle 20 may be fixed, or a rocking mechanism for the liquid nozzle 20 may be provided separately from the above-described rocking mechanism for the plasma source 30.

The plasma source 30 includes a pipe 33, a first electrode 31, and a second electrode 32. Also, the plasma source 30 may include an insulating sheath portion 36. The pipe 33 includes a gas inlet (upper side in FIG. 5) which receives the gas supplied from the gas delivery unit 39, and a gas outlet (lower side in FIG. 5) disposed to face the substrate SB. At least a part of the first electrode 31 is disposed in the pipe 33. As illustrated in FIG. 5, the first electrode 31 may protrude from the gas inlet. On the other hand, the first electrode 31 may do not protrude from the gas outlet. In other words, the first electrode 31 may be disposed above the gas outlet. The second electrode 32 is disposed outside the pipe 33. Also, the second electrode 32 is away from a path of the processing liquid supplied onto the substrate SB. Specifically, the second electrode 32 is attached on a side surface of the pipe 33 and faces the first electrode 31 via the pipe 33, an internal space of the pipe 33, and the insulating sheath portion 36. The insulating sheath portion 36 covers the first electrode 31 to separate a space in which the plasma PL is generated from the first electrode 31.

The AC power supply 40 applies an AC voltage between the first electrode 31 and the second electrode 32. In that case, a potential of the second electrode 32 may be a reference potential. As a modified example, a direct current (DC) pulse power supply may be used instead of the AC power supply 40. In that case, for example, the first electrode 31 is an anode and the second electrode 32 is a cathode.

Next, a substrate processing method using the substrate processing apparatus 101 will be described below.

The substrate holder 10 holds the substrate SB. The substrate SB is rotated by rotation of the substrate holder 10. The liquid delivery unit 29 delivers the processing liquid to the liquid nozzle 20. Thereby, the processing liquid is discharged from the liquid nozzle 20 onto the substrate SB. As a result, the liquid film LQ of the processing liquid is formed on the substrate SB. Here, a thickness of the liquid film LQ may be in a range of 0.3 to 2.0 mm, and may be about 1 mm.

The gas delivery unit 39 delivers the gas into the pipe 33 of the plasma source 30 as illustrated by the arrow in FIG. 5, and the AC power supply 40 applies an AC voltage between the first electrode 31 and the second electrode 32. Thereby, the plasma source 30 generates the plasma PL. The plasma PL extends from the gas outlet of the pipe 33 to the liquid film LQ along with a flow of the gas. Thereby, the plasma PL is radiated to the liquid film LQ. In other words, a plasma jet is blown onto the substrate SB.

The above-described radiation is performed using the plasma PL that is partially disposed in a circumferential direction DP (FIG. 4) for the rotation of the substrate SB while the substrate SB is rotated. Also, the above-described radiation is performed while a position of the plasma PL is rocked in the radial direction DR (FIG. 4) for the rotation of the substrate SB.

Formation of the liquid film LQ described above is started when supply of the processing liquid onto the substrate SB is started and is stopped when supply of the processing liquid onto the substrate SB is stopped. Further, presence of the liquid film LQ can be maintained even after the supply of the processing liquid is stopped unless the substrate SB rotates at a high speed. The radiation of the plasma PL is performed after the supply of the processing liquid is started and before the supply of the processing liquid is stopped. Thereby, a process of radiating the plasma PL is performed while supplying the processing liquid.

When the plasma PL is radiated, radicals are generated in the liquid film LQ. The oxidizing power of the radicals promotes the processing on the substrate SB. Specifically, removal of the resist film (not illustrated) from the substrate SB is promoted.

Further, after the substrate processing described above, usually, a rinsing process and a drying process of the substrate SB are performed. For example, the rinsing process is performed by discharging pure water onto the substrate SB, and the drying process is performed by isopropyl alcohol (IPA) drying.

According to the present embodiment, the plasma PL (FIG. 5) is radiated to the liquid film LQ of the processing liquid containing at least one of sulfuric acid, a sulfate, peroxosulfuric acid, and a peroxosulfate, or the processing liquid containing hydrogen peroxide. Thereby, radicals having a strong oxidizing power are generated in the liquid film LQ. Therefore, the substrate processing using the oxidizing power of the processing liquid can be effectively performed. Specifically, the resist film can be effectively removed from the substrate SB.

The processing liquid may contain sulfuric acid. In this case, peroxomonosulfuric acid (Caro's acid) can be generated by the radiation of the plasma to the sulfuric acid. This generation may be performed using the plasma radiation without using hydrogen peroxide. In that case, a burden of waste liquid treatment can be alleviated, and the recycling of the sulfuric acid can be facilitated. Here, when a processing liquid containing sulfuric acid is used, a concentration of the sulfuric acid may be in a range of 94 to 98%, and may be about 96%.

The plasma PL (FIG. 5) is partially disposed in the circumferential direction DP (FIG. 4). The plasma PL can be radiated throughout in the circumferential direction DP in accordance with the rotation of the substrate SB while using the plasma PL that is disposed only partially in the circumferential direction DP as described above.

In the radial direction DR (FIG. 4), a position of the plasma source 30, that is, a position of the plasma PL (FIG. 5) is rocked. Thereby, the plasma PL can be radiated in a wide range in accordance with the rocking of the plasma PL and the rotation of the substrate SB while using the plasma PL that is disposed only partially in the radial direction DR.

The processing liquid is supplied during radiation of the plasma PL. Thereby, the processing liquid is replaced during radiation of the plasma PL. Therefore, reduction in processing effects due to deterioration of the processing liquid can be suppressed.

The radiation of the plasma PL is performed by blowing a plasma jet onto the substrate SB. That is, the substrate processing using the plasma jet can be performed.

The plasma source 30 includes the first electrode 31 disposed in the pipe 33 of the gas and the second electrode 32 disposed outside the pipe 33. Thereby, the plasma jet using the gas injected from the pipe 33 can be generated.

The second electrode 32 is away from the path of the processing liquid supplied onto the substrate SB. Thereby, the plasma PL can be generated without bringing any of the first electrode 31 and the second electrode 32 into contact with the processing liquid.

Further, the formation of the liquid film LQ is started when supply of the processing liquid onto the substrate SB is started and is stopped when supply of the processing liquid onto the substrate SB is stopped. Presence of the liquid film LQ can be maintained even after the supply of the processing liquid is stopped unless the substrate SB rotates at a high speed. In that case, the radiation of the plasma PL may be performed after the supply of the processing liquid is stopped. Thereby, the plasma PL is radiated without adding the processing liquid onto the substrate SB. Therefore, consumption of the processing liquid can be reduced.

As a modified example, the substrate SB may be stopped without being rotated during the radiation of the plasma PL. In that case, the plasma source 30 may have a large size in a direction intersecting the rocking direction (the arrow DS in FIG. 4). Thereby, even when the substrate SB is not rotated, the plasma PL can be radiated in a wide range on the substrate SB by the rocking of the plasma source 30. In this case, the mechanism for rotating the substrate SB may be omitted.

Second Embodiment

Figure 7:
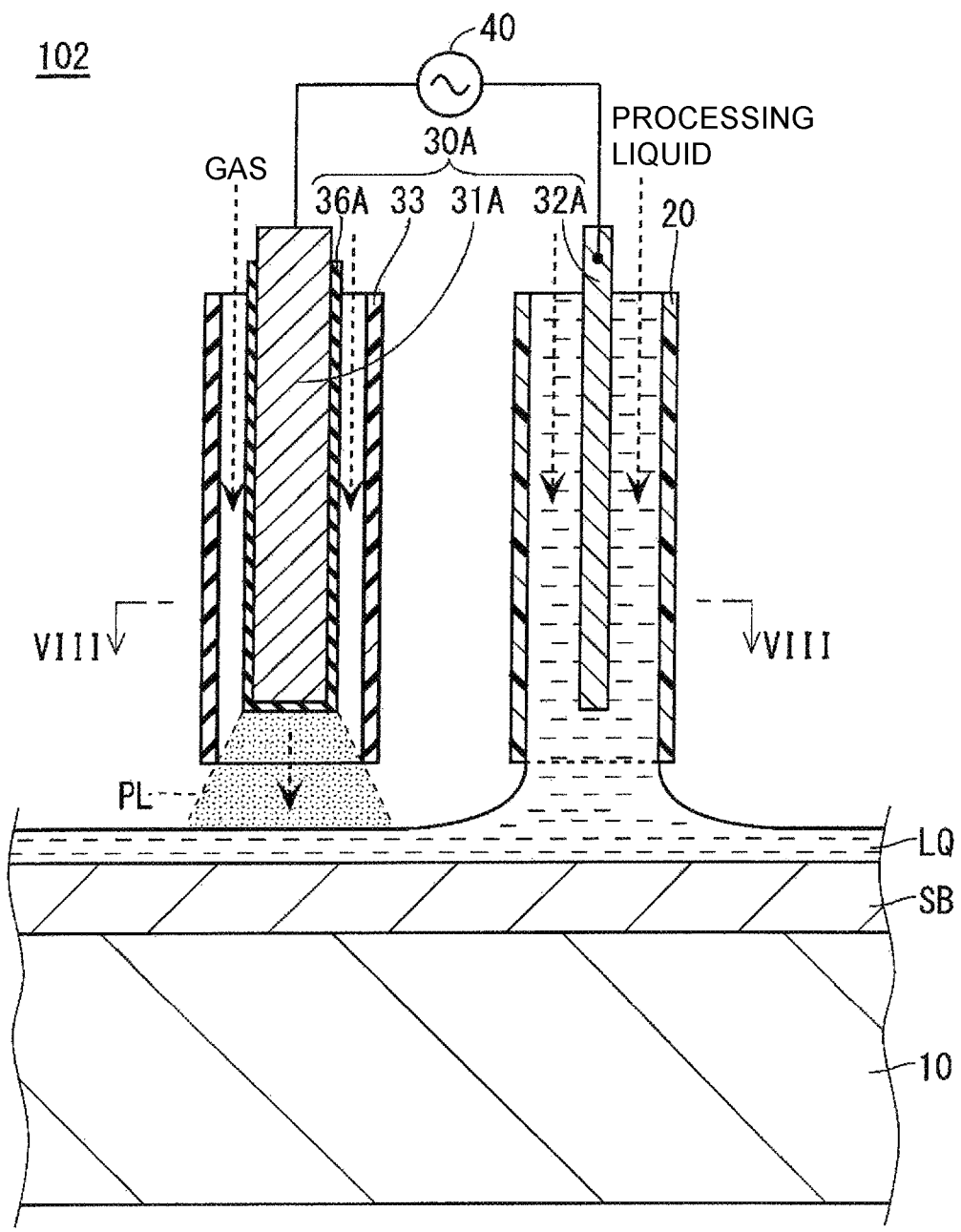
FIG. 7 is a partial cross-sectional view schematically illustrating a configuration of a substrate processing apparatus according to a second embodiment of the disclosure in a field of view corresponding to FIG. 5.
Figure 8:
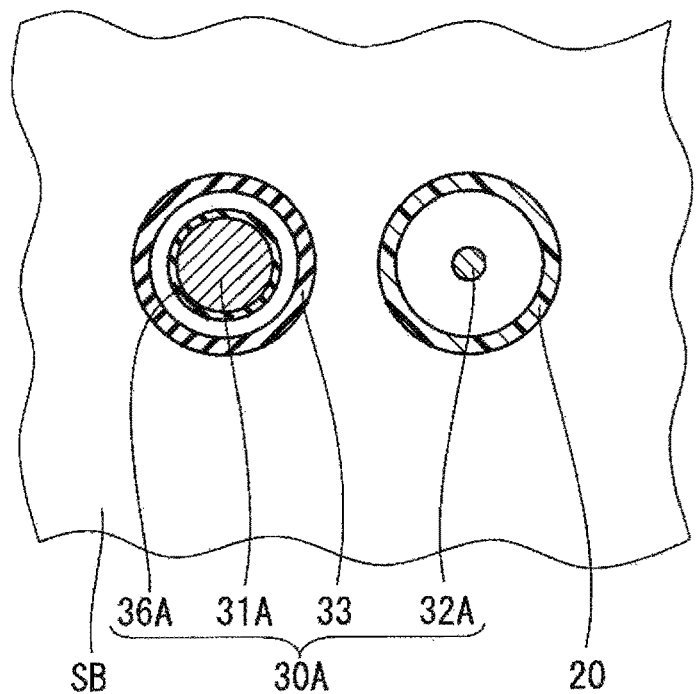
FIG. 8 is a schematic partial cross-sectional view along line VIII-VIII of FIG. 7.

FIG. 7 is a partial cross-sectional view schematically illustrating a configuration of a substrate processing apparatus 102 according to a second embodiment in a field of view corresponding to FIG. 5. FIG. 8 is a schematic partial cross-sectional view along line VIII-VIII of FIG. 7. The substrate processing apparatus 102 includes a plasma source 30A instead of the plasma source 30 (FIGS. 5 and 6 of the first embodiment).

The plasma source 30A includes a first electrode 31A and a second electrode 32A. Also, the plasma source 30A may include an insulating sheath portion 36A. A disposition of the first electrode 31A and the insulating sheath portion 36A may be the same as that of the first electrode 31 and the insulating sheath portion 36 (FIGS. 5 and 6 of the first embodiment). However, a surface of the first electrode 31A facing a liquid film LQ may have a large area. In order to secure such a large area, an area of the first electrode 31A may be a half or more of an area of an internal space of a pipe 33 in a cross section of the pipe 33 perpendicular to a direction in which a gas flows (an area in the field of view in FIG. 8). The second electrode 32A is disposed outside the pipe 33 and is in contact with a path of a processing liquid supplied onto the substrate SB. Specifically, at least a part of the second electrode 32A is disposed in a liquid nozzle 20. As illustrated in FIG. 7, the second electrode 32A may protrude from a liquid inlet of the liquid nozzle 20.

Since configurations other than the above are substantially the same as the configurations of the above-described first embodiment, the same or corresponding elements are denoted by the same reference signs and description thereof will not be repeated.

According to the present embodiment, the second electrode 32A is in contact with the path of the processing liquid supplied onto the substrate SB. Thereby, a plasma PL extending from the first electrode 31A to the liquid film LQ of the processing liquid can be generated.

Third Embodiment

Figure 9:
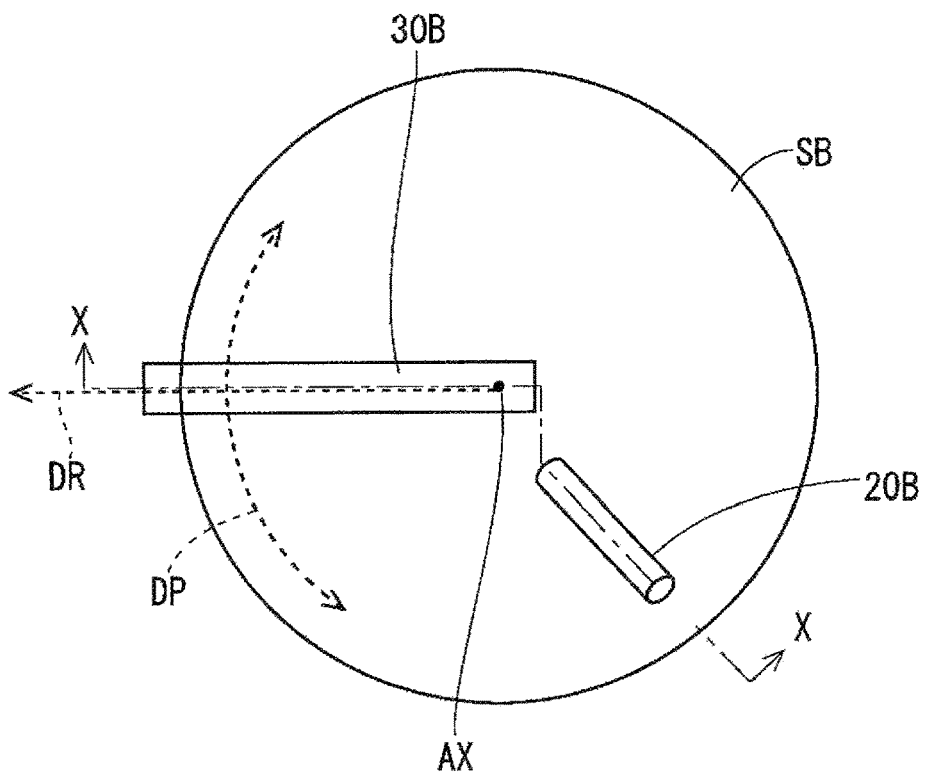
FIG. 9 is a plan view schematically illustrating a disposition of a liquid supply unit and a plasma source included in a substrate processing apparatus according to a third embodiment of the disclosure.
Figure 10:
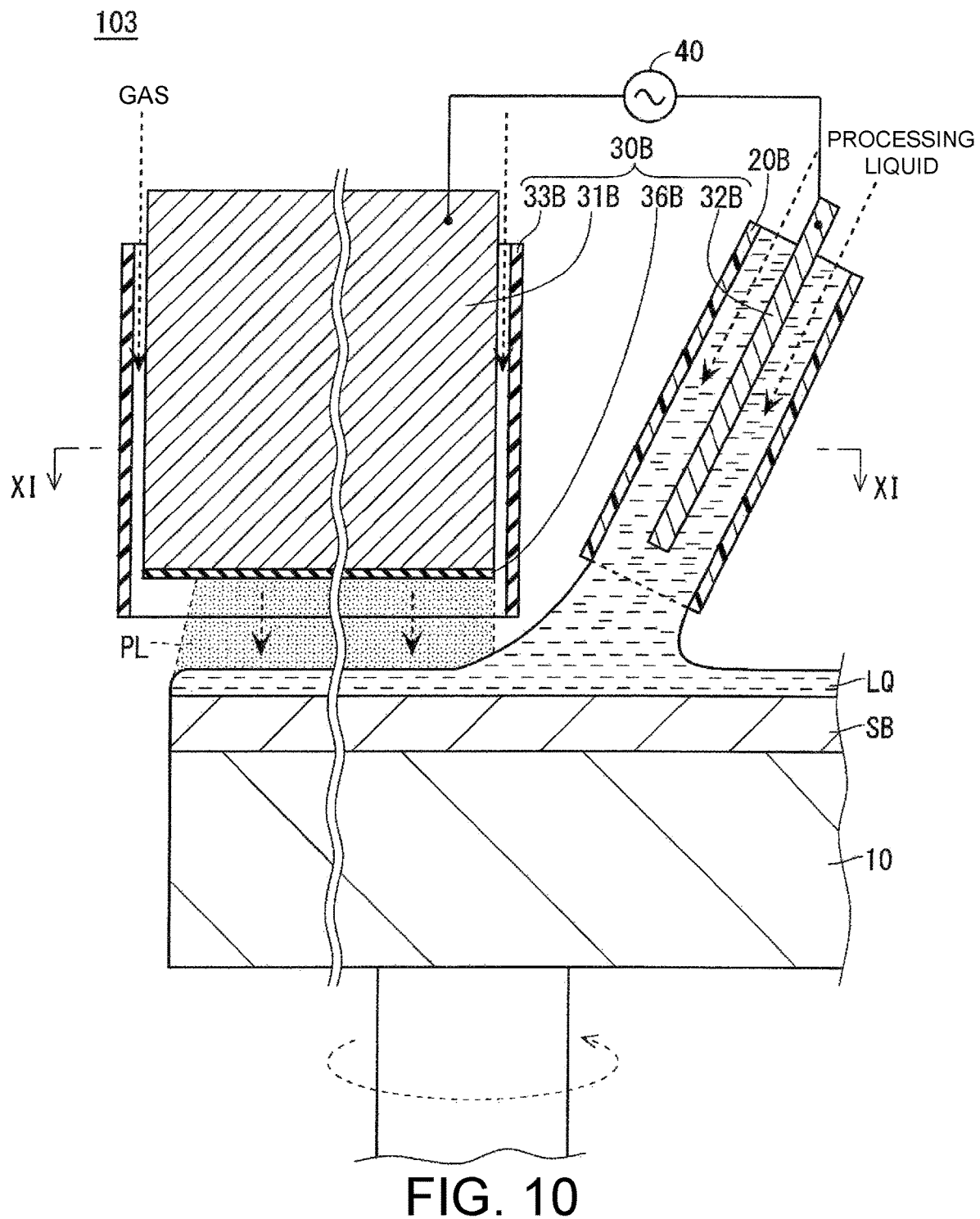
FIG. 10 is a schematic partial cross-sectional view along line X-X of FIG. 9.
Figure 11:
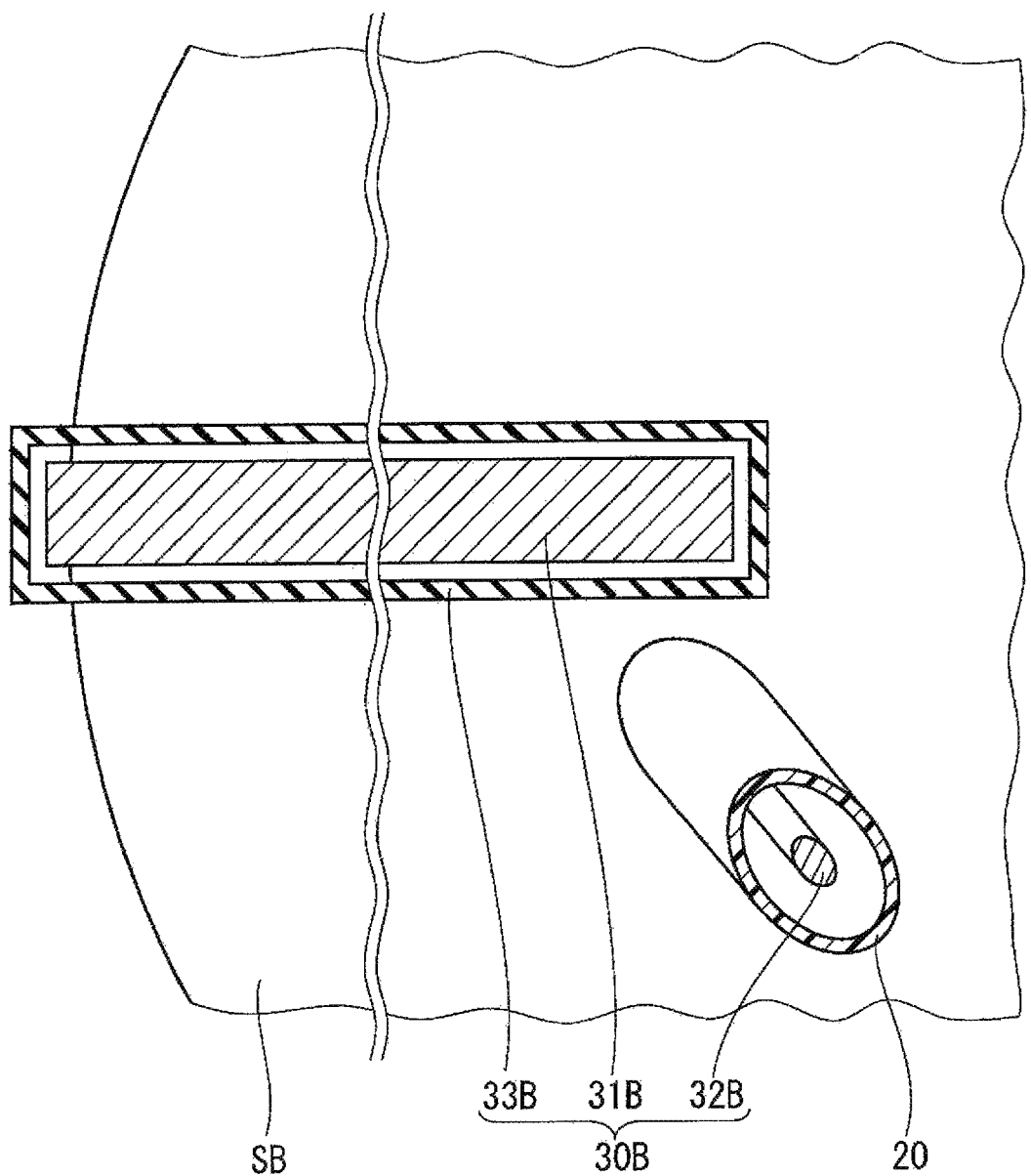
FIG. 11 is a schematic partial cross-sectional view along line XI-XI of FIG. 10.

FIG. 9 is a plan view schematically illustrating a disposition of a liquid nozzle 20B and a plasma source 30B included in a substrate processing apparatus 103 according to a third embodiment. Each of the liquid nozzle 20B and the plasma source 30B is provided in the substrate processing apparatus 103 instead of the liquid nozzle 20 and the plasma source 30A (FIGS. 7 and 8 of the second embodiment). FIG. 10 is a schematic partial cross-sectional view along line X-X of FIG. 9. FIG. 11 is a schematic partial cross-sectional view along line XI-XI in FIG. 10.

The plasma source 30B includes a pipe 33B, a first electrode 31B, and a second electrode 32B. Also, the plasma source 30B may include an insulating sheath portion 36B. As in the second electrode 32A (FIGS. 7 and 8 of the second embodiment), at least a part of the second electrode 32B is disposed in the liquid nozzle 20B. The insulating sheath portion 36B covers the first electrode 31B to separate a space in which the plasma PL is generated from the first electrode 31B.

The plasma source 30B is configured to be able to generate the plasma PL (FIG. 10) that extends over an entire position in the radial direction DR of the substrate SB (FIG. 9). For the purpose described above, as illustrated in FIG. 9, the plasma source 30B may extend over the entire position in the radial direction DR of the substrate SB (FIG. 9), and the first electrode 31B may extend over the entire position in the radial direction DR of the substrate SB (FIG. 9).

With the above configuration, the plasma source 30B is positioned above a central position of the substrate SB (a substrate holder 10). The liquid nozzle 20B may have a posture in which a discharge port thereof faces the central position while the liquid nozzle 20B being disposed away from the central position. In other words, a direction in which the liquid nozzle 20B extends may be inclined so that the discharge port faces the central position. Thereby, the processing liquid can be supplied to the central position while the liquid nozzle 20B is not disposed at the central position.

Plasma radiation in a substrate processing method using the substrate processing apparatus 103 is performed using the plasma PL that extends over the entire position in the radial direction DR of the substrate SB while the substrate SB is rotated. Therefore, the substrate processing apparatus 103 has a mechanism for rotating the substrate SB described in the first embodiment, but rocking of the plasma PL is not performed, and therefore the mechanism for that may be omitted.

Since configurations other than the above are substantially the same as the configurations of the above-described first or second embodiment, the same or corresponding elements are denoted by the same reference signs and description thereof will not be repeated.

According to the present embodiment, the plasma PL (FIG. 10) extending over the entire position in the radial direction DR (FIG. 9) is used. Therefore, the plasma PL can be radiated over the entire substrate SB in accordance with the rotation of the substrate SB without rocking the position of the plasma PL in the radial direction DR.

Fourth Embodiment

Figure 12:
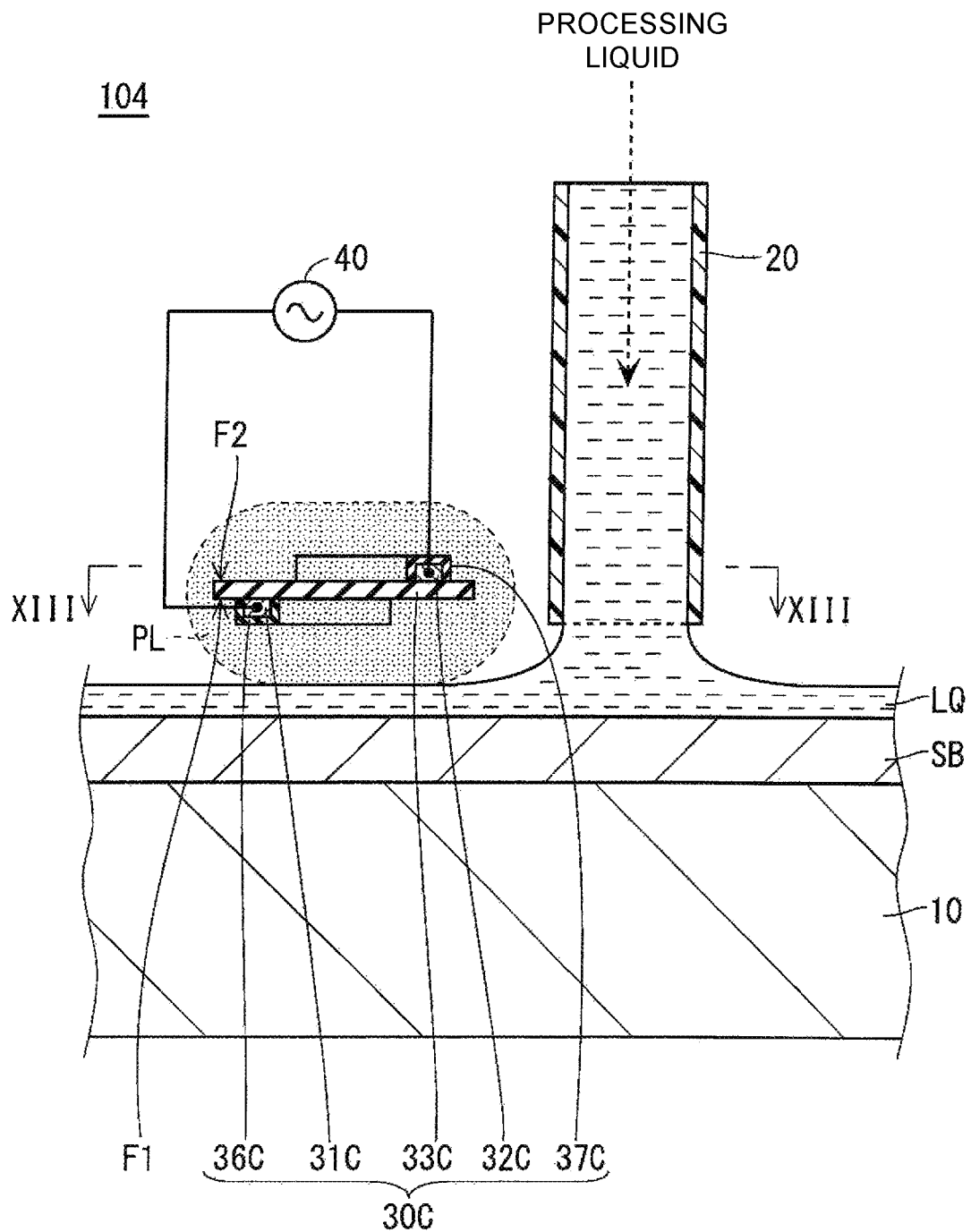
FIG. 12 is a partial cross-sectional view schematically illustrating a configuration of a substrate processing apparatus according to a fourth embodiment of the disclosure in a field of view corresponding to FIG. 5.
Figure 13:
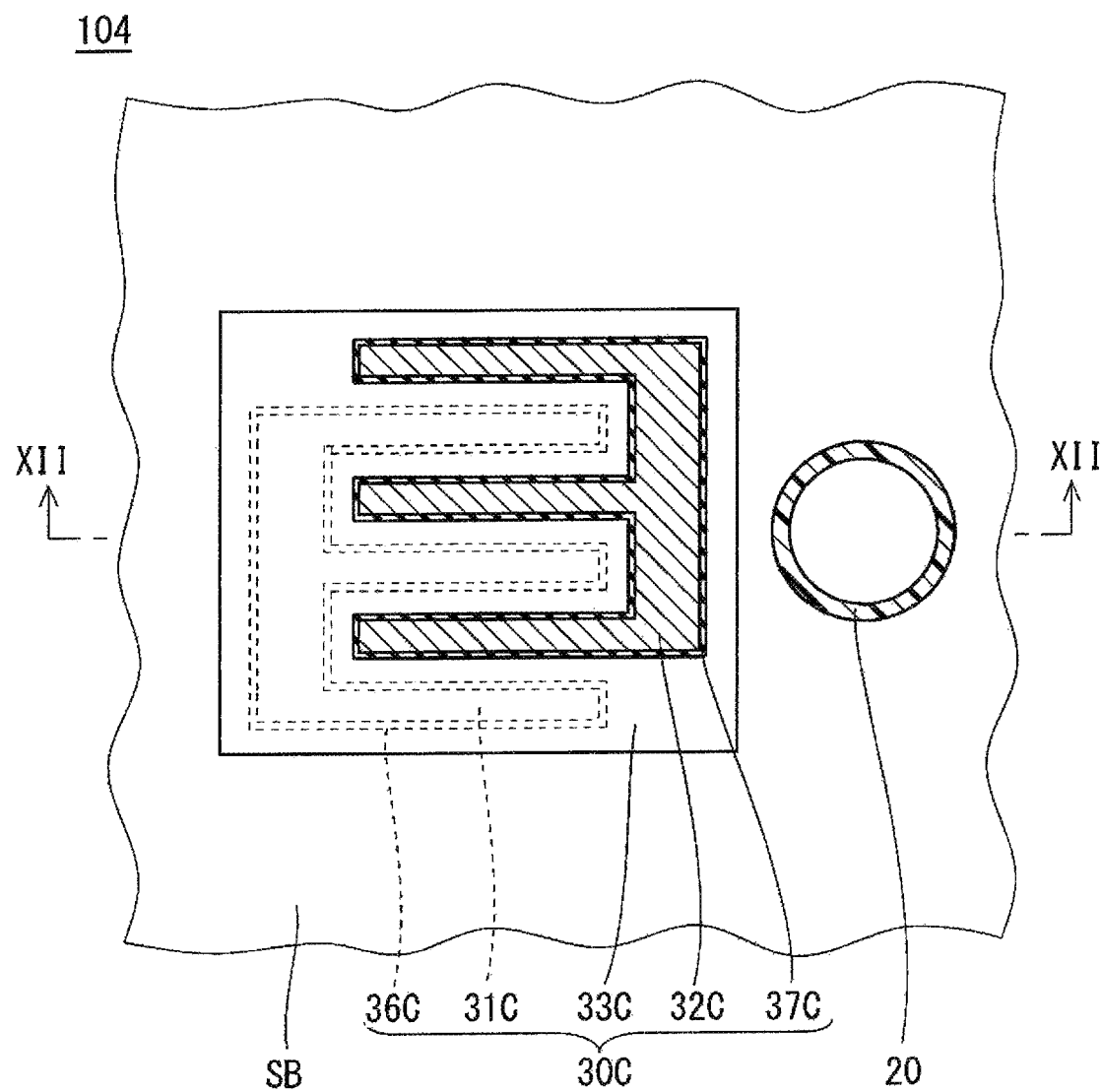
FIG. 13 is a schematic partial cross-sectional view along line XIII-XIII of FIG. 12.

FIG. 12 is a partial cross-sectional view schematically illustrating a configuration of a substrate processing apparatus 104 according to a fourth embodiment in a field of view corresponding to FIG. 5. FIG. 13 is a schematic partial cross-sectional view along line XIII-XIII in FIG. 12.

The substrate processing apparatus 104 includes a plasma source 30C instead of the plasma source 30 (FIGS. 5 and 6 of the first embodiment). The plasma source 30C includes a dielectric layer 33C, a first electrode 31C, and a second electrode 32C. Also, the plasma source 30C may include an insulating sheath portion 36C and an insulating sheath portion 37C. The dielectric layer 33C includes a lower surface F1 (first surface) facing a liquid film LQ and an upper surface F2 (second surface on a side opposite to the first surface). The first electrode 31C is disposed on the lower surface F1 away from the liquid film LQ. The second electrode 32C is disposed on the upper surface F2. As illustrated in FIG. 13, the first electrode 31C and the second electrode 32C may be a pair of comb-shaped electrodes which are meshed with each other in a plane layout parallel to the dielectric layer 33C. The insulating sheath portion 36C covers the first electrode 31C to separate a space in which a plasma PL is generated from the first electrode 31C. The insulating sheath portion 37C covers the second electrode 32C to separate a space in which the plasma PL is generated from the first electrode 32C.

Generation of the plasma PL in a substrate processing method using the substrate processing apparatus 104 is performed by turning an atmosphere around the plasma source 30C into a plasma. Therefore, in the embodiment, the gas delivery unit 39 (FIG. 3 of the first embodiment) is unnecessary. The atmosphere around the plasma source 30C may be substantially static. Further, a slight flow for gradually replacing the atmosphere in the chamber 80 (FIG. 1) is much smaller than the flow for generating the plasma jet as in the first to third embodiments described above. Therefore, a state in which the static state is slightly disturbed due to the former flow is also regarded as a static state in the present specification. Radiation of the plasma PL in the present embodiment is performed while the atmosphere in the plasma PL is kept static.

The plasma source 30C is rocked similarly to the plasma source 30 (FIG. 4 of the first embodiment). When this rocking and rotation of the substrate SB are performed, the plasma PL can be radiated in a wide range on the substrate SB. As a first modified example, similarly to the plasma source 30B (FIG. 9 of the third embodiment), the plasma source 30C may generate the plasma PL that extends over the entire position in the radial direction DR of the substrate SB. In that case, the plasma source 30C may extend over the entire position in the radial direction DR of the substrate SB. In the present modified example, the rocking of the plasma source 30C is unnecessary. As a second modified example, the plasma source 30C may generate the plasma PL that substantially covers an entire surface of the substrate SB. In that case, the plasma source 30C may substantially cover the entire surface of the substrate SB. In the present modified example, rotation of the substrate SB is also unnecessary from the perspective of plasma radiation. However, the substrate SB may be rotated from the perspective of forming the liquid film LQ. Further, when a size of the plasma source is increased as in the above-described first and second modified examples of the fourth embodiment, the rocking can be omitted or both the rocking and the rotation can be omitted also in the other embodiments described above.

Since configurations other than the above are substantially the same as the configurations of any of the above-described first to third embodiments, the same or corresponding elements are denoted by the same reference signs and description thereof will not be repeated.

According to the present embodiment, the plasma PL can be generated while the atmosphere in the plasma PL is kept static. Thereby, the liquid film LQ being disturbed by a flow of the atmosphere can be avoided. Therefore, the substrate processing being disturbed due to the disturbance in the liquid film LQ can be avoided.

While the disclosure has been illustrated and described in detail, the foregoing description is in all configurations illustrative and the disclosure is not limited thereto. It is therefore understood that numerous modifications and variations can be devised without departing from the scope of the disclosure. The configurations described in the above-described embodiments and modified examples can be appropriately combined or omitted as long as they do not contradict each other.

A first configuration is a substrate processing method including a process of forming a liquid film of a processing liquid containing at least one of sulfuric acid, a sulfate, peroxosulfuric acid, and a peroxosulfate, or a processing liquid containing hydrogen peroxide, and a process of radiating a plasma to the liquid film.

A second configuration is the substrate processing method according to the first configuration, in which the process of radiating the plasma may be performed using the plasma which is partially disposed in a circumferential direction for rotation of a substrate while the substrate is rotated.

A third configuration is the substrate processing method according to the second configuration, in which the process of radiating the plasma may include a process of rocking a position of the plasma in a radial direction for the rotation of the substrate.

A fourth configuration is the substrate processing method according to the second configuration, in which the process of radiating the plasma may be performed using the plasma extending over an entire position in the radial direction of the substrate.

A fifth configuration is the substrate processing method according to any one of the first to fourth configurations, in which the process of radiating the plasma may include a process of blowing a plasma jet onto the substrate.

A sixth configuration is the substrate processing method according to any one of the first to fourth configurations, in which the process of radiating the plasma may include a process of keeping an atmosphere in the plasma static.

A seventh configuration is the substrate processing method according to any one of the first to sixth configurations, in which the process of forming the liquid film may include a process of starting supply of the processing liquid onto the substrate, and a process of stopping supply of the processing liquid onto the substrate, and the process of radiating the plasma may be performed after the process of starting supply of the processing liquid and before the process of stopping supply of the processing liquid.

An eighth configuration is the substrate processing method according to any one of the first to seventh configurations, in which the process of forming the liquid film may include a process of starting supply of the processing liquid onto the substrate, and a process of stopping supply of the processing liquid onto the substrate, and the process of radiating the plasma may be performed after the process of stopping supply of the processing liquid.

A ninth configuration is a substrate processing apparatus which processes a substrate using a processing liquid containing at least one of sulfuric acid, a sulfate, peroxosulfuric acid, and a peroxosulfate, or a processing liquid containing hydrogen peroxide, and the substrate processing apparatus includes a holding unit which holds the substrate, a liquid supply unit which supplies the processing liquid onto the substrate so that a liquid film of the processing liquid is formed on the substrate, and a plasma source which radiates a plasma to the liquid film.

A tenth configuration is the substrate processing apparatus according to the ninth configuration further including a rotation drive unit which rotates the holding unit to obtain rotation of the substrate, in which the plasma source may be configured to be rockable in a radial direction for rotation of the substrate.

An eleventh configuration is the substrate processing apparatus according to the ninth configuration further including a rotation drive unit which rotates the holding unit to obtain rotation of the substrate, in which the plasma source may generate the plasma which extends over an entire position in a radial direction of the substrate.

A twelfth configuration is the substrate processing apparatus according to any one of the ninth to eleventh configurations, in which the plasma source may include a pipe having a gas inlet which receives supply of a gas and a gas outlet disposed to face the substrate, a first electrode disposed in the pipe, and a second electrode disposed outside the pipe.

A thirteenth configuration is the substrate processing apparatus according to the twelfth configuration, in which the second electrode may be away from a path of the processing liquid supplied onto the substrate.

A fourteenth configuration is the substrate processing apparatus according to the twelfth configuration, in which the second electrode may be in contact with a path of the processing liquid supplied onto the substrate.

A fifteenth configuration is the substrate processing apparatus according to any one of the ninth to eleventh configurations, in which the plasma source may include a dielectric layer having a first surface facing the liquid film and a second surface on a side opposite to the first surface, a first electrode disposed on the first surface away from the liquid film, and a second electrode disposed on the second surface.

According to the first configuration, the plasma is radiated to the liquid film of the processing liquid containing at least one of sulfuric acid, a sulfate, peroxosulfuric acid, and a peroxosulfate, or the processing liquid containing hydrogen peroxide. Thereby, radicals having a strong oxidizing power are generated in the liquid film. Therefore, substrate processing using the oxidizing power of the processing liquid can be effectively performed.

According to the second configuration, the plasma partially disposed in the circumferential direction is used. Thereby, the plasma can be radiated throughout in the circumferential direction in accordance with rotation of the substrate while using the plasma that is disposed only partially in the circumferential direction.

According to the third configuration, a position of the plasma is rocked in the radial direction. Thereby, the plasma can be radiated in a wide range in accordance with the rocking of the plasma and the rotation of the substrate while using the plasma that is disposed only partially in the radial direction.

According to the fourth configuration, the plasma extending over the entire position in the radial direction is used. Therefore, the plasma can be radiated with respect to the entire substrate in accordance with the rotation of the substrate without rocking the position of the plasma in the radial direction.

According to the fifth configuration, the plasma jet is blown onto the substrate. Thereby, the substrate processing using the plasma jet can be performed.

According to the sixth configuration, the atmosphere in the plasma is kept static. Thereby, the liquid film being disturbed by a flow of the atmosphere can be avoided.

According to the seventh configuration, the plasma is radiated while the processing liquid is supplied. Thereby, the processing liquid is replaced during radiation of the plasma. Therefore, reduction in processing effects due to deterioration of the processing liquid can be suppressed.

According to the eighth configuration, the plasma is radiated after supply of the processing liquid is stopped. Thereby, consumption of the processing liquid can be reduced. According to the ninth configuration, the plasma is radiated to the liquid film of the processing liquid containing at least one of sulfuric acid, a sulfate, peroxosulfuric acid, and a peroxosulfate, or the processing liquid containing hydrogen peroxide. Thereby, radicals having a strong oxidizing power are generated in the liquid film. Therefore, the substrate processing using the oxidizing power of the processing liquid can be effectively performed.

According to the tenth configuration, a position of the plasma is rocked in the radial direction. Thereby, the plasma can be radiated in a wide range in accordance with the rocking of the plasma and the rotation of the substrate while using the plasma that is disposed only partially in the radial direction.

According to the eleventh configuration, the plasma extending over the entire position in the radial direction is used. Therefore, the plasma can be radiated with respect to the entire substrate in accordance with the rotation of the substrate without rocking the position of the plasma in the radial direction.

According to the twelfth configuration, the plasma source includes the first electrode disposed in the pipe of the gas, and the second electrode disposed outside the pipe. Thereby, the plasma jet using the gas injected from the pipe can be generated.

According to the thirteenth configuration, the second electrode is away from the path of the processing liquid supplied onto the substrate. Thereby, the plasma can be generated without bringing the first electrode and the second electrode into contact with the processing liquid. According to the fourteenth configuration, the second electrode is in contact with the path of the processing liquid supplied onto the substrate. Thereby, the plasma extending from the first electrode to the liquid film of the processing liquid can be generated.

According to the fifteenth configuration, the plasma source includes the dielectric layer having the first surface facing the liquid film and the second surface on a side opposite to the first surface, the first electrode disposed on the first surface away from the liquid film, and the second electrode disposed on the second surface. Thereby, the plasma can be generated while the atmosphere in the plasma is kept static. Therefore, the liquid film being disturbed by a flow of the atmosphere can be avoided. Accordingly, the substrate processing being disturbed due to the disturbance in the liquid film can be avoided.

What is claimed is:

1. A substrate processing method comprising:
    a process of forming a liquid film of a processing liquid containing at least one of sulfuric acid, a sulfate, peroxosulfuric acid, and a peroxosulfate, or a processing liquid containing hydrogen peroxide on a substrate; and
    a process of radiating a plasma to the liquid film formed on the substrate,
    wherein the process of radiating the plasma comprises a process of processing the substrate by radicals generated in the liquid film due to a radiation of the plasma to the liquid film,
    wherein during the process of radiating the plasma, the liquid film of the processing liquid is maintained to cover an entire surface of the substrate with a thickness in a range of 0.3 to 2.0 mm, and
wherein the process of radiating the plasma includes a process of keeping an atmosphere in the plasma static.

2. The substrate processing method according to claim 1, wherein the process of radiating the plasma is performed using the plasma which is partially disposed in a circumferential direction of rotation of the substrate while the substrate is rotated.

3. The substrate processing method according to claim 2, wherein the process of radiating the plasma includes a process of rocking a position of the plasma in a radial direction for the rotation of the substrate.

4. The substrate processing method according to claim 2, wherein the process of radiating the plasma is performed using the plasma extending over an entire position in the radial direction of the substrate.

5. The substrate processing method according to claim 1, wherein the process of forming the liquid film includes:
   a process of starting supply of the processing liquid onto the substrate; and
   a process of stopping supply of the processing liquid onto the substrate, and
   the process of radiating the plasma is performed after the process of starting supply of the processing liquid and before the process of stopping supply of the processing liquid.

6. The substrate processing method according to claim 1, wherein the process of forming the liquid film includes:
   a process of starting supply of the processing liquid onto the substrate; and
   a process of stopping supply of the processing liquid onto the substrate, and
   the process of radiating the plasma is performed after the process of stopping supply of the processing liquid.

7. The substrate processing method according to claim 1,
wherein the process of radiating the plasma is performed by radiating the plasma from a plasma source to the liquid film, and
wherein during the process of radiating the plasma, the plasma source and the substrate are separated by the liquid film.

8. A substrate processing method comprising:
a process of forming a liquid film of a processing liquid containing at least one of sulfuric acid, a sulfate, peroxosulfuric acid, and a peroxosulfate, or a processing liquid containing hydrogen peroxide on a substrate; and
a process of radiating a plasma to the liquid film formed on the substrate,
wherein the process of radiating the plasma comprises a process of processing the substrate by radicals generated in the liquid film due to a radiation of the plasma to the liquid film, and
wherein the process of radiating the plasma includes a process of keeping an atmosphere in the plasma static.

* * * * *